US012777581B2

(12) United States Patent
Yang et al.

(10) Patent No.: US 12,777,581 B2
(45) Date of Patent: Oct. 27, 2026

(54) CIRCUIT BOARD STRUCTURE AND MANUFACTURING METHOD THEREOF

(71) Applicant: Unimicron Technology Corp., Taoyuan City (TW)

(72) Inventors: Kai-Ming Yang, Hsinchu County (TW); Chen-Hao Lin, Keelung City (TW); Chin-Sheng Wang, Taoyuan City (TW); Cheng-Ta Ko, Taipei City (TW); Pu-Ju Lin, Hsinchu City (TW)

(73) Assignee: Unimicron Technology Corp., Taoyuan City (TW)

( * ) Notice: Subject to any disclaimer, the term of this patent is extended or adjusted under 35 U.S.C. 154(b) by 356 days.

(21) Appl. No.: 18/172,324

(22) Filed: Feb. 22, 2023

(65) Prior Publication Data

US 2024/0251504 A1 Jul. 25, 2024

(30) Foreign Application Priority Data

Jan. 19, 2023 (TW) ................................ 112102586

(51) Int. Cl.
*H05K 1/02* (2006.01)
*H05K 3/06* (2006.01)
*H05K 3/46* (2006.01)

(52) U.S. Cl.
CPC ........... *H05K 1/0298* (2013.01); *H05K 3/067* (2013.01); *H05K 3/4679* (2013.01); *H05K 2201/09454* (2013.01); *H05K 2203/0789* (2013.01)

(58) Field of Classification Search
CPC .................................................... H05K 1/0298
USPC .......................................................... 174/261
See application file for complete search history.

(56) References Cited

U.S. PATENT DOCUMENTS

2006/0225917 A1* 10/2006 Hu ......................... H05K 1/113 29/842
2021/0098416 A1* 4/2021 Bihler ................. H01L 21/4853
2023/0041747 A1* 2/2023 Rathburn ............. H05K 3/4679

FOREIGN PATENT DOCUMENTS

TW 200637449 10/2006
TW I331494 10/2010
TW I368307 7/2012

OTHER PUBLICATIONS

"Office Action of Taiwan Counterpart Application", issued on Sep. 13, 2023, p. 1-p. 4.

* cited by examiner

*Primary Examiner* — Stanley Tso
(74) *Attorney, Agent, or Firm* — JCIPRNET

(57) ABSTRACT

The invention provides a circuit board structure and a manufacturing method thereof. The circuit board structure includes a line portion, a first insulating layer, and a conductive terminal. The first insulating layer is disposed on the line portion. The conductive terminal is disposed on the first insulating layer and embedded in the first insulating layer to be electrically connected with the line portion. The conductive terminal includes a first portion, a second portion, and a third portion. The first portion protrudes from a surface of the first insulating layer. The second portion is embedded in the first insulating layer and connected to the first portion. The third portion is disposed between the line portion and the second portion. A width of the second portion is greater than a width of the third portion.

5 Claims, 10 Drawing Sheets

CIRCUIT BOARD STRUCTURE AND MANUFACTURING METHOD THEREOF

CROSS-REFERENCE TO RELATED APPLICATION

This application claims the priority benefit of Taiwan application serial no. 112102586, filed on Jan. 19, 2023. The entirety of the above-mentioned patent application is hereby incorporated by reference herein and made a part of this specification.

BACKGROUND

Technical Field

The disclosure relates to a substrate structure and a manufacturing method thereof, and more particularly to a circuit board structure and a manufacturing method thereof.

Description of Related Art

With the advancement and development of science and technology, the circuit board structure is developing towards miniaturization and high integration. Generally speaking, in the design of a fine pitch pad, the opening of the solder mask is usually used to define the pad, and then a corresponding solder ball is planted on the pad for joining with other components. However, with such a joining method, the solder ball is easy to break at the interface between the solder ball and the pad, resulting in the solder ball falling off and reducing reliability. In addition, the opening of the solder mask requires precise alignment, otherwise it is easy to expose the pad and cause abnormality, resulting in a drop in yield.

SUMMARY

The disclosure provides a circuit board structure and a manufacturing method thereof, which may enhance the alignment tolerance of the process through the simplified process, thereby increasing the process yield. The circuit board structure may also have more wire routing space and the reliability of the conductive terminal may be enhanced.

The circuit board structure of the disclosure includes a line portion, a first insulating layer, and a conductive terminal. The first insulating layer is disposed on the line portion. The conductive terminal is disposed on the first insulating layer and embedded in the first insulating layer to be electrically connected with the line portion. The conductive terminal includes a first portion, a second portion, and a third portion. The first portion protrudes from a surface of the first insulating layer. The second portion is embedded in the first insulating layer and connected to the first portion. The third portion is disposed between the line portion and the second portion. A width of the second portion is greater than a width of the third portion.

In an embodiment of the disclosure, the third portion has a first width on a side close to the line portion, the third portion has a second width on a side away from the line portion, and the first width is greater than the second width.

In an embodiment of the disclosure, the above circuit board structure further includes a conductive connecting member disposed between the third portion and the line portion.

In an embodiment of the disclosure, a side of the conductive connecting member in contact with the third portion has a third width, a side of the conductive connecting member in contact with the line portion has a fourth width, and the fourth width is greater than the third width.

In an embodiment of the disclosure, the third width is substantially equal to the first width.

In an embodiment of the disclosure, an included angle between a side wall of the third portion and a top surface of the conductive connecting member is between 30 degrees and 85 degrees.

In an embodiment of the disclosure, the circuit board structure further includes a carrier, and the line portion is disposed on the carrier.

The manufacturing method of the circuit board structure of the disclosure includes the following process. A line structure is formed on a first carrier. The line structure has a first surface and a second surface opposite the first surface, and the first surface faces the first carrier. The line structure includes a first pad layer, a first insulating layer, a line portion, and a conductive connection portion. The first pad layer is close to the first surface of the line structure and disposed on the first carrier. The first insulating layer covers the first pad layer. The line portion is disposed on the first insulating layer. The conductive connection portion penetrates the first insulating layer, so that the line portion is electrically connected to the first pad layer; Afterwards, the first carrier is removed to expose the first surface of the line structure. The first pad layer is removed to form a first opening. A portion of the conductive connection portion is removed to form a second opening, and a conductive connecting member is formed by the conductive connection portion that has not been removed. The second opening and the first opening are connected to each other and expose the conductive connecting member, and a width of the first opening is greater than a width of the second opening. A conductive terminal is formed in the first opening and the second opening.

In an embodiment of the disclosure, the second opening has a first width on a side close to the conductive connecting member, the second opening has a second width on a side away from the conductive connecting member, and the first width is greater than the second width.

In an embodiment of the disclosure, a method of removing the first pad layer and removing the portion of the conductive connection portion includes wet etching.

In an embodiment of the disclosure, an etchant used in the wet etching includes sodium persulfate solution, sulfuric acid-hydrogen peroxide solution, nitric acid solution, copper chloride solution, or ammonium chloride solution.

In an embodiment of the disclosure, before removing the first carrier, a second carrier is disposed on the second surface of the line structure.

In an embodiment of the disclosure, a depth of the second opening is half of a height of the conductive connection portion before being partially removed.

Based on the above, the conductive terminal of the circuit board structure of the disclosure includes the first portion protruding from the insulating layer and the second portion and third portion embedded in the insulating layer, which may save the space of a portion of the pad and make the space more effective for wire routing design. In addition, through the design of a narrow top and wide bottom structure in the third portion, the conductive terminal is effectively fixed in the insulating layer, thereby reducing the possibility of the conductive terminal breaking and falling off and improving the reliability thereof. The manufacturing method of the circuit board structure of the disclosure uses the etching conductive portion to form the opening of the conductive terminal, which may improve the alignment tolerance in the process, simplify the process, and increase the process yield.

DESCRIPTION OF THE EMBODIMENTS

Figure 1:
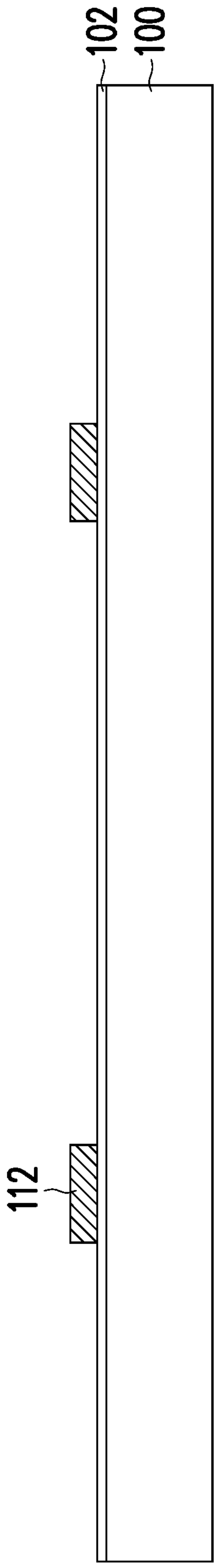
FIG. 1 to FIG. 8 are cross-sectional schematic views of a manufacturing flow of a circuit board structure according to an embodiment of the disclosure.

In the drawings, for clarity, the thickness of layers, films, plates, areas, and the like are magnified. Throughout the specification, the same reference numerals denote the same elements.

It should be understood that when an element such as a layer, a film, an area, or a substrate is indicated to be "on" another element or "connected to" another element, it may be directly on another element or connected to another element, or an element in the middle may exist. In contrast, when an element is indicated to be "directly on another element" or "directly connected to" another element, an element in the middle does not exist. As used herein. "to connect" may indicate to physically and/or electrically connect. Furthermore, "to electrically connect" or "to couple" may also be used when other elements exist between two elements.

It should be understood that, although the terms "first", "second", "third", or the like may be used herein to describe various elements, components, regions, layers, and/or portions, these elements, components, regions, and/or portions should not be limited by these terms. These terms are only used to distinguish one element, component, region, layer, or portion from another element, component, region, layer, or portion. Thus, "first element." "component." "region," "layer." or "portion" discussed below could be termed a second element, component, region, layer, or portion without departing from the teachings herein.

Terms such as "about", "approximately". "basically" or "substantially" appearing in the content of the application cover not only the explicitly stated values and numerical ranges, but also a range of permissible deviations that are understandable to those with ordinary knowledge in the technical field of the invention. The deviation range is determined by the error generated during the measurement, and the error is caused by, for example, the limitation of the measurement system or process conditions. Additionally. "about" may mean within one or more standard deviations of the aforementioned values, e.g., within ±20%, ±10%, or ±5%. Terms such as "about". "approximately". "basically" or "substantially" appearing in content of the application may refer to a more acceptable deviation range or standard deviation depending on optical properties, etching properties, mechanical properties, or other properties, and all of the above optical properties, etching properties, mechanical properties, and other properties may not be applied with one standard deviation.

FIG. 1 to FIG. 8 are cross-sectional schematic views of a manufacturing flow of a circuit board structure according to an embodiment of the disclosure. FIG. 7A is a partial enlarged cross-sectional schematic view of the region R1 in FIG. 7. FIG. 8A is a partial enlarged cross-sectional schematic view of the region R2 in FIG. 8.

Referring to FIG. 1 to FIG. 4, a line structure ST is formed on a first carrier 100, the line structure ST has a first surface S1 and a second surface S2 opposite the first surface S1, and the first surface S1 faces the first carrier 100. The line structure ST may include multiple conductive layers 110 alternately stacked (e.g., including a first pad layer 112, a first conductive layer 114, a second conductive layer 116, a third conductive layer 118, and a second pad layer 119) and multiple insulating layers 120 (e.g., including a first insulating layer 122, a second insulating layer 124, a third insulating layer 126, and a fourth insulating layer 128). In some embodiments, the materials of the conductive layers 110 may include copper, silver, gold, alloys of the above materials, or other suitable metal materials. The material of the insulating layers 120 may be photosensitive dielectric materials, such as polyimide (PI), phenolic resin, benzocyclobutene (BCB), or other suitable materials, and the disclosure is not limited thereto.

In detail, regarding the manufacturing method of the line structure ST, the first carrier 100 may be first provided, as shown in FIG. 1. The first carrier 100 may be glass, steel plate, or other suitable materials, and the disclosure is not limited thereto as long as the carrier 100 is able to carry the formed or disposed component thereon. Then, a releasing layer 102 is formed on the first carrier 100, so that the first carrier 100 is separated from the film layer formed in the subsequent process step through the releasing layer 102. In some embodiments, the releasing layer 102 is, for example, made of materials with weak adhesion. In other embodiments, the adhesion of the materials that make up the releasing layer is reduced by a thermal process, ultraviolet (UV) process, laser process, or other similar process. Afterwards, the first pad layer 112 is formed on the first carrier 100. The first pad layer 112 may first form a seed layer (not shown) on the releasing layer 102 by sputtering, then form a patterned photoresist layer (not shown) on the seed layer to expose the seed layer corresponding to the circuit pattern, and form a plating layer (not shown) on the exposed seed layer by electroplating. Afterwards, the patterned photoresist layer and the seed layer under the patterned photoresist layer are removed to form the first pad layer 112. For clarity, only the first pad layer 112 is shown in FIG. 1, and the first pad layer 112 that has the seed layer and the plating layer is not shown.

Figure 2:
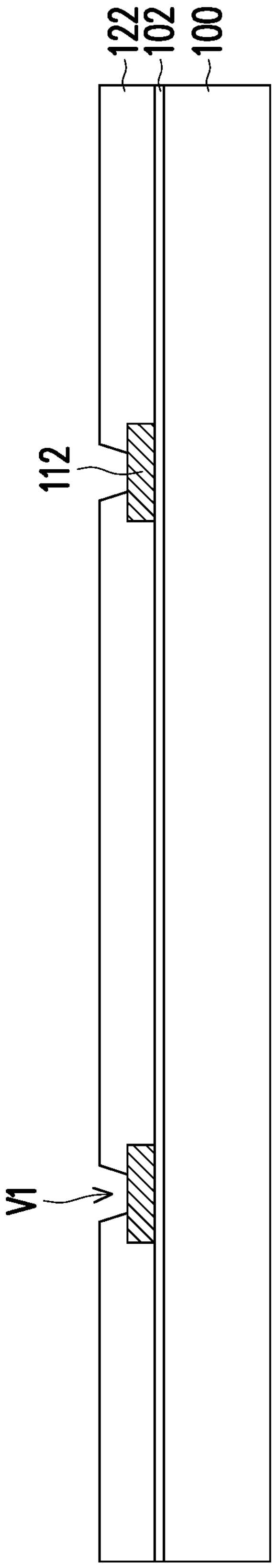

Referring to FIG. 2, the first insulating layer 122 is formed on the first pad layer 112. The first insulating layer 122 has a via V1. The first insulating layer 122 may be formed by knife coating, spin coating, or other suitable processes, and then the via V1 is formed by a lithography process. For example, a photomask (not shown) is used as a mask to cure a portion of the photosensitive dielectric material by photopolymerization and/or baking. Moreover, after curing a portion of the photosensitive dielectric material, the uncured remaining photosensitive dielectric material is removed by wet clean or other suitable methods, so as to form the first insulating layer 122 including the via V1. The via V1 penetrates a portion of the first insulating layer 122 and exposes a portion of the first pad layer 112. The cross-sectional shape of the via V1 is, for example, tapered, so that the width of the via V1 away from the first carrier 100 is greater than the width of the via V1 close to the first carrier 100.

Figure 3:
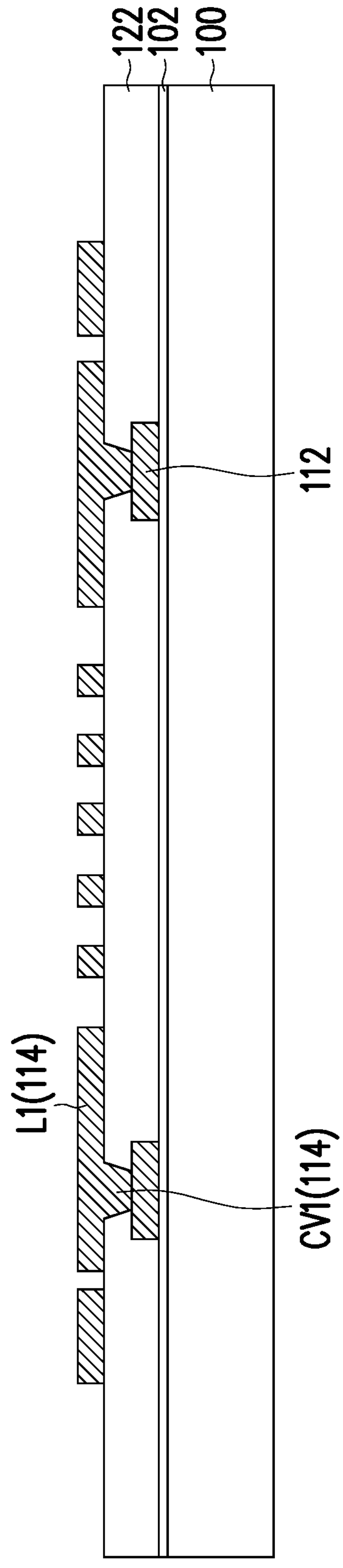

Referring to FIG. 3, a conductive connection portion CV1 is formed in the via V1, and a line portion L1 is formed on the first insulating layer 122. For example, a seed layer (not shown) may be first formed on the first insulating layer 122 and a side wall and a bottom surface of the via V1 by sputtering, then a patterned photoresist layer (not shown) is formed on the seed layer to expose the seed layer corresponding to the circuit pattern, and a plating layer (not shown) is formed on the exposed seed layer by electroplating. Afterwards, the patterned photoresist layer and the seed layer under the patterned photoresist layer are removed to form the first conductive layer 114. For clarity, only the first conductive layer 114 is shown in FIG. 2, and the first conductive layer 114 that has the seed layer and the plating layer are not shown. The first conductive layer 114 may include the conductive connection portion CV1 located in the via V1 and the line portion L1 located on the first insulating layer 122. The conductive connection portion CV1 provides the electrical connection of the first conductive layer 114 and the first pad layer 112 in a vertical direction, and the line portion L1 provides the electrical connection of the first conductive layer 114 in a horizontal direction.

Figure 4:
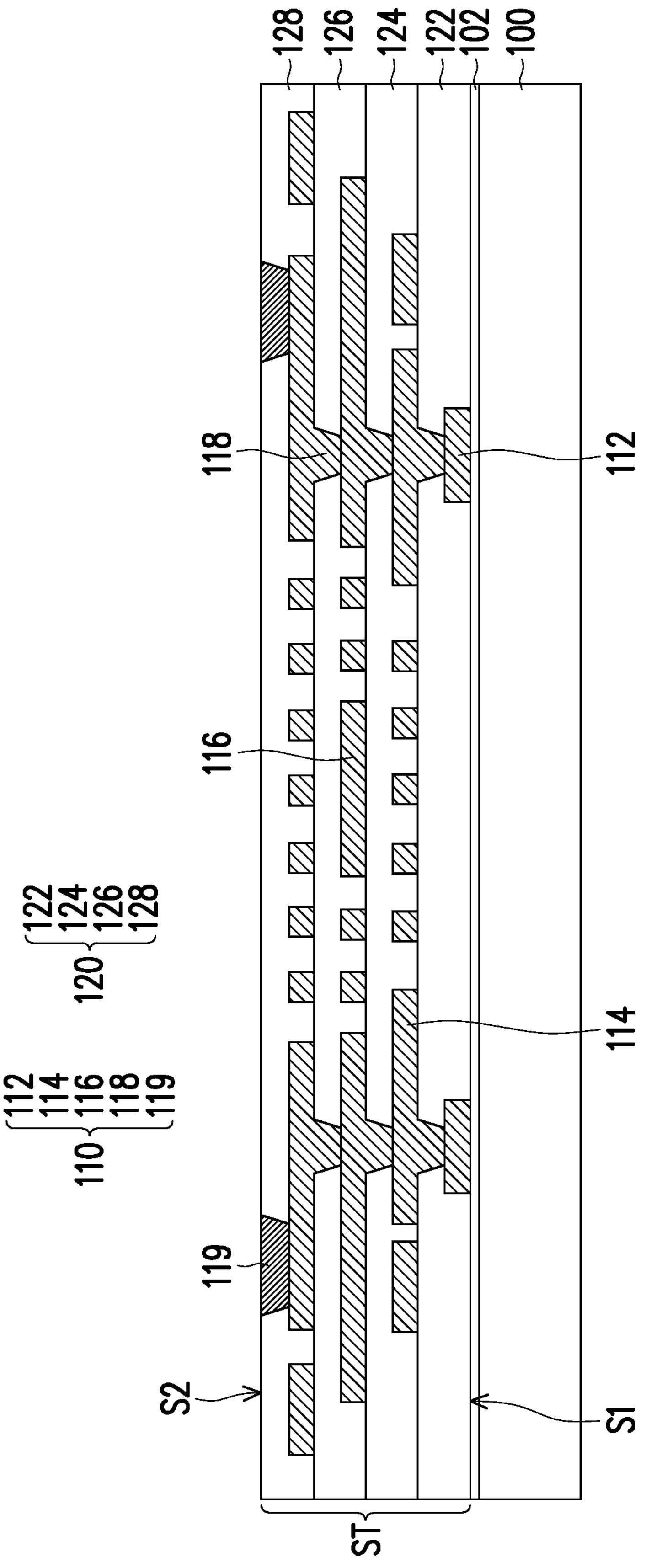

Referring to FIG. 4, the second insulating layer 124, the second conductive layer 116, the third insulating layer 126, the third conductive layer 118, and the fourth insulating layer 128 are sequentially formed on the first insulating layer 122. The second conductive layer 116 and the third conductive layer 118, including a conductive connection portion (not marked) and a line portion (not marked), respectively, may be formed in a manner similar to that of the first conductive layer 114 described above. The second insulating layer 124, the third insulating layer 126, and the fourth insulating layer 128 may be formed in a manner similar to that of the first insulating layer 122 described above. In some embodiments, the line structure ST further includes a second pad layer 119 embedded in the fourth insulating layer 128 and electrically connected to the third circuit layer 118, but the disclosure is not limited thereto. The second pad layer 119 may be formed in a manner similar to the first pad layer 112. In some embodiments, the second pad layer 119 may be an under bump metal (UBM) layer. In other embodiments, the fourth insulating layer 128 may completely cover the third circuit layer 118 without exposing the third circuit layer 118.

In FIG. 4, the first pad layer 112, the first insulating layer 122, the first conductive layer 114, the second insulating layer 124, the second conductive layer 116, the third insulating layer 126, the third conductive layer 118, the fourth insulating layer 128, and the second pad layer 119 may form the line structure ST. In some embodiments, a bottom surface of the first pad layer 112 and a bottom surface of the first insulating layer 122 may form the first surface S1 of the line structure ST. A top surface of the fourth insulating layer 128 may form the second surface S2 of the line structure ST. Although FIG. 4 schematically shows five layers of the conductive layer 110 and four layers of the insulating layer 120, they are not intended to limit the disclosure. The number of layers of the conductive layer 110 and the insulating layer 120 in the line structure ST is adjusted according to actual requirements.

Figure 5:
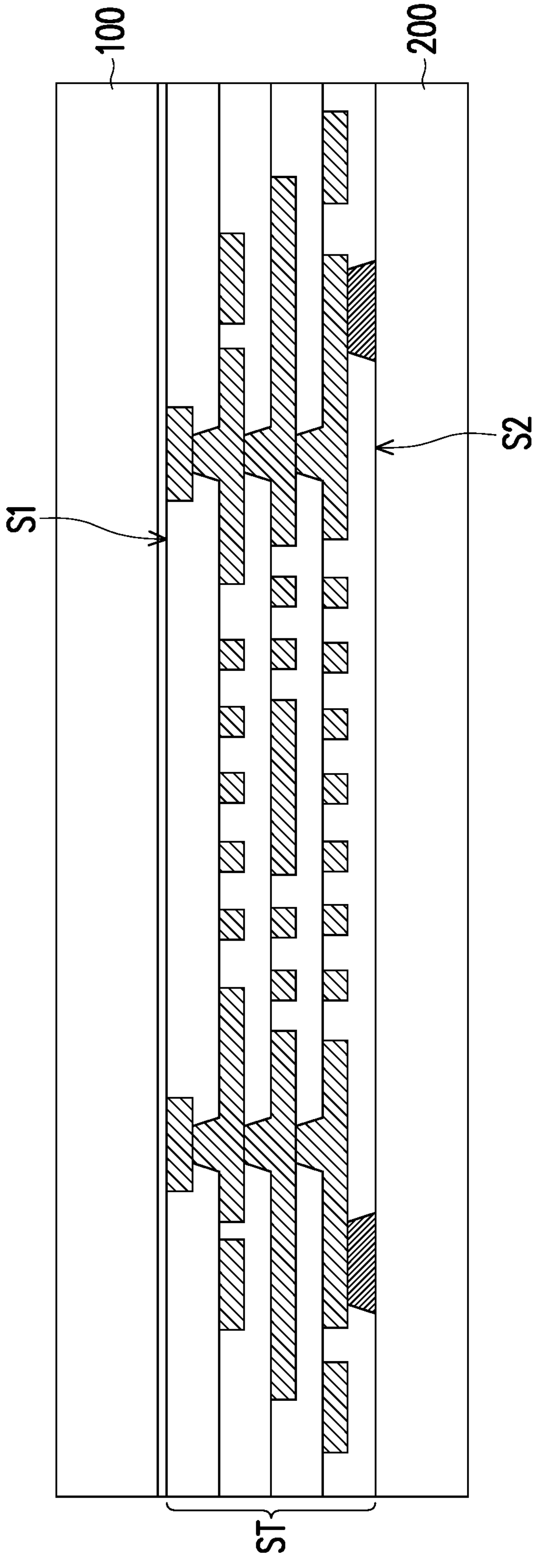

Referring to FIG. 5, a second carrier 200 is disposed on the second surface S2 of the line structure ST, and then the line structure ST is turned upside down, so that the first carrier 100 is located on top in FIG. 5 and the second carrier 200 is located at the bottom in FIG. 5. In some embodiments, the second carrier 200 may be a core substrate, a printed circuit board, or other suitable substrates, and is connected to the second pad layer 119 of the line structure ST through corresponding conductive members, but the disclosure is not limited thereto. In other embodiments, the second carrier 200 may be made of glass, steel plate, or other suitable materials, as a temporary carrier for carrying the line structure ST, which is removed in the subsequent process and connects the line structure ST to the outside. In the embodiment where the second carrier 200 is used as a temporary carrier, a releasing layer (not shown) may be formed between the second carrier 200 and the line structure ST, but the disclosure is not limited thereto.

Figure 6:
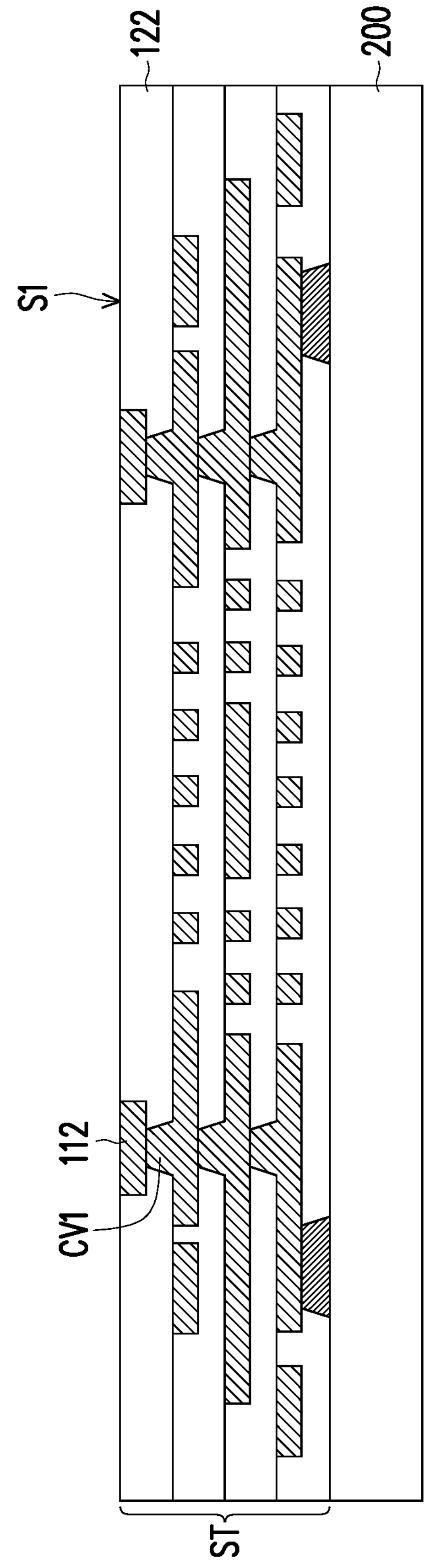

Referring to FIG. 6, the first carrier 100 is removed to expose the first surface S1 of the line structure ST. That is, the first pad layer 112 and the first insulating layer 122 are exposed. For example, external energy is applied to the releasing layer 102 by means of ultraviolet light, laser, visible light, or heat, so as to reduce the adhesion of the releasing layer 102, and then remove the releasing layer 102 and the carrier first carrier 100 at the same time. In some embodiments, the first carrier 100 may also be removed by mechanical peeling or other suitable removal process, and the disclosure is not limited thereto.

Figure 7:
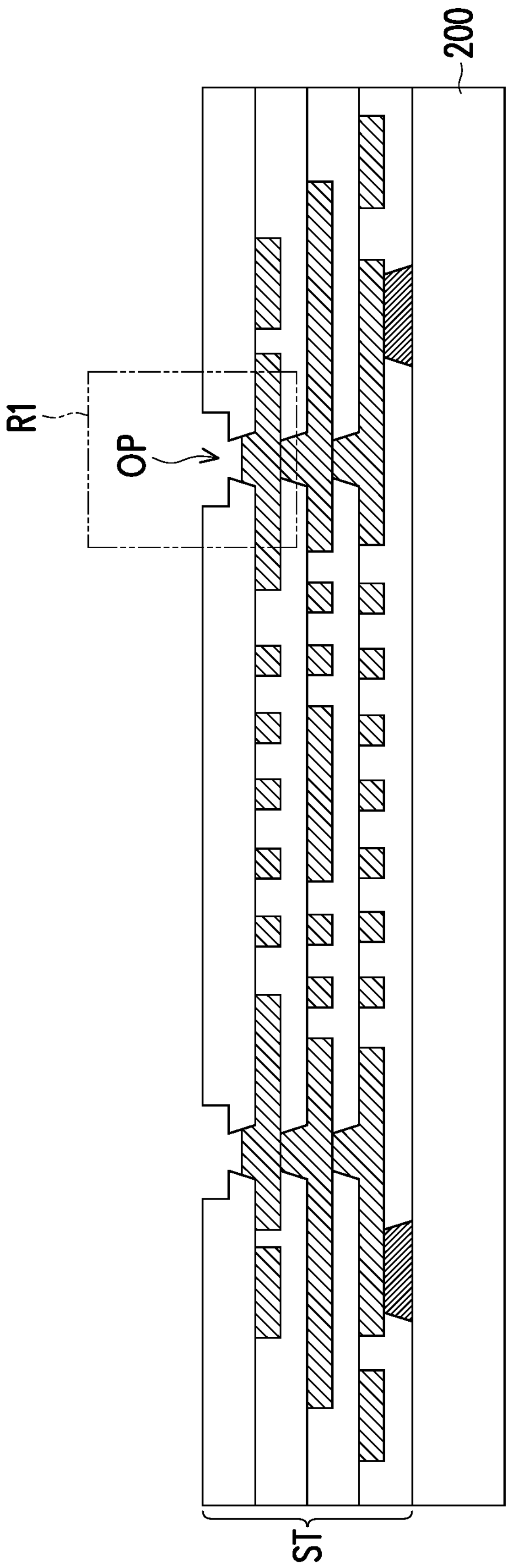
Figure 7A:
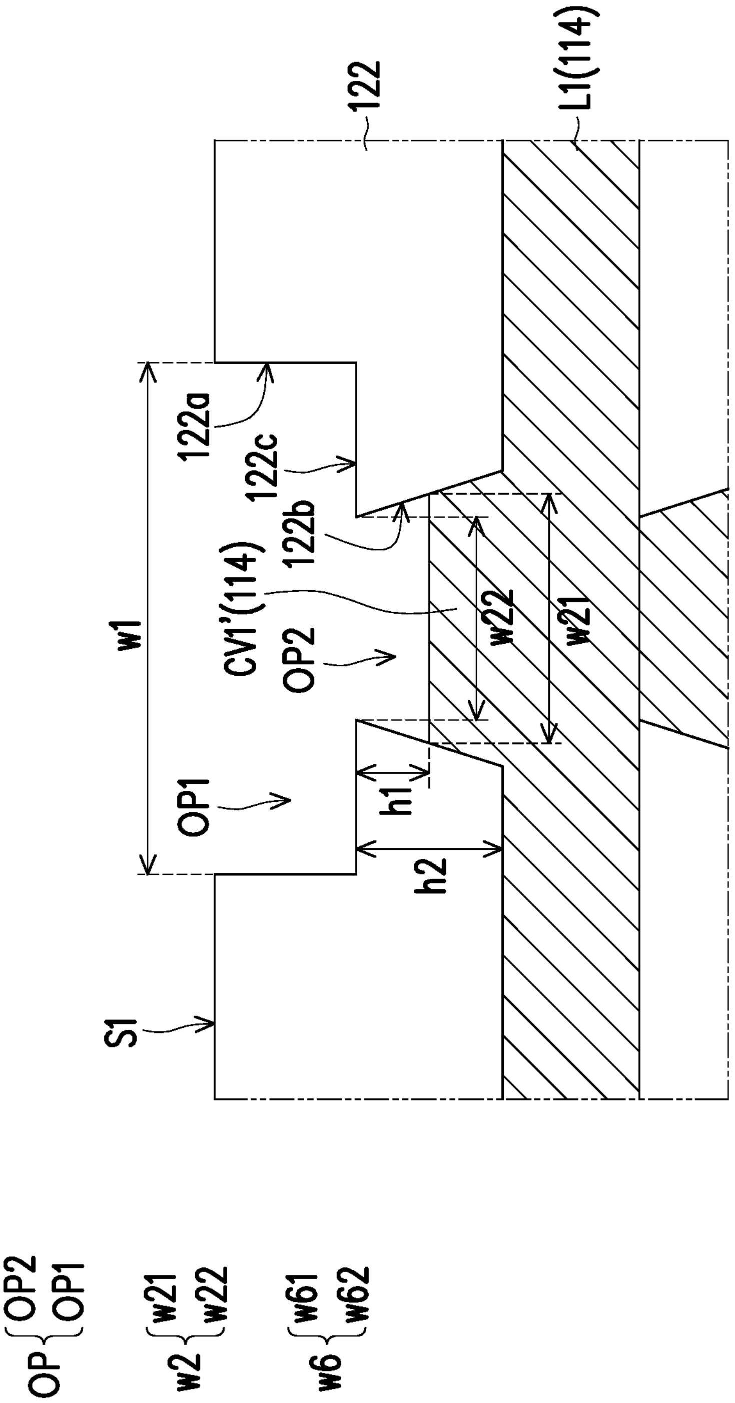
FIG. 7A is a partial enlarged cross-sectional schematic view of FIG. 7.

Referring to FIG. 7 and FIG. 7A, the first pad layer 112 is removed to form a first opening OP1. A portion of the conductive connection portion CV1 (marked in FIG. 6) is removed to form a second opening OP2, and a conductive connecting member CV1' is formed by the conductive connection portion CV1 that has not been removed. For example, the first pad layer 112 and a portion of the conductive connection portion CV1 may be removed by wet etching. That is, the first pad layer 112 and a portion of the conductive connection portion CV1 may be removed in the same process, but the disclosure is not limited thereto. The etchant used in wet etching may include sodium persulfate solution (SPS), sulfuric acid-hydrogen peroxide solution, nitric acid solution, copper chloride solution ($CuCl_2$), ammonium chloride solution ($NH_4Cl$), or other etchants suitable for etching the conductive material.

The first insulating layer 122 has a first inner side wall 122*a*, a second inner side wall 122*b*, and a connecting surface 122*c* connecting the first inner side wall 122*a* and the second inner side wall 122*b*. After removing the first pad layer 112 and a portion of the conductive connection portion CV1, the first inner side wall 122*a*, the second inner side wall 122*b*, and the connecting surface 122*c* are exposed. The first inner side wall 122*a* is connected to the first surface S1. The first inner side wall 122*a*, the connecting surface 122*c*, and the second inner side wall 122*b* may define an opening OP with a stepped side wall, and the opening OP may include the first opening OP1 and the second opening OP2 connected to each other. The first opening OP1 is defined by the first inner side wall 122*a*, and the second opening OP2 is defined by the second inner side wall 122*b*. A width w1 of the first opening OP1 is greater than a width w2 of the second opening OP2, so that the conductive connecting member CV1' is exposed by the opening OP (namely, the first opening OP1 and the second opening OP2).

In some embodiments, a depth h1 of the second opening OP2 (i.e., the distance from the top surface of the conductive connecting member CV1' to the connecting surface 122*c*) is half of a height h2 of the conductive connection portion CV1 before being partially removed, but the disclosure is not limited thereto. The depth h1 of the second opening OP2 may be adjusted by controlling the etching time according to actual requirements.

The second inner side wall 122*b* is an inclined side wall to define a second opening OP2 with a narrow top and a wide bottom. That is, the second opening OP2 has a first width w21 on a side close to the conductive connecting member CV1', the second opening OP2 has a second width w22 on a side away from the conductive connecting member CV1', and the first width w21 is greater than the second width w22.

Forming the opening OP on the first insulating layer 122 using the above method may simplify the process and increase the alignment tolerance, thereby increasing the process yield.

Figure 8:
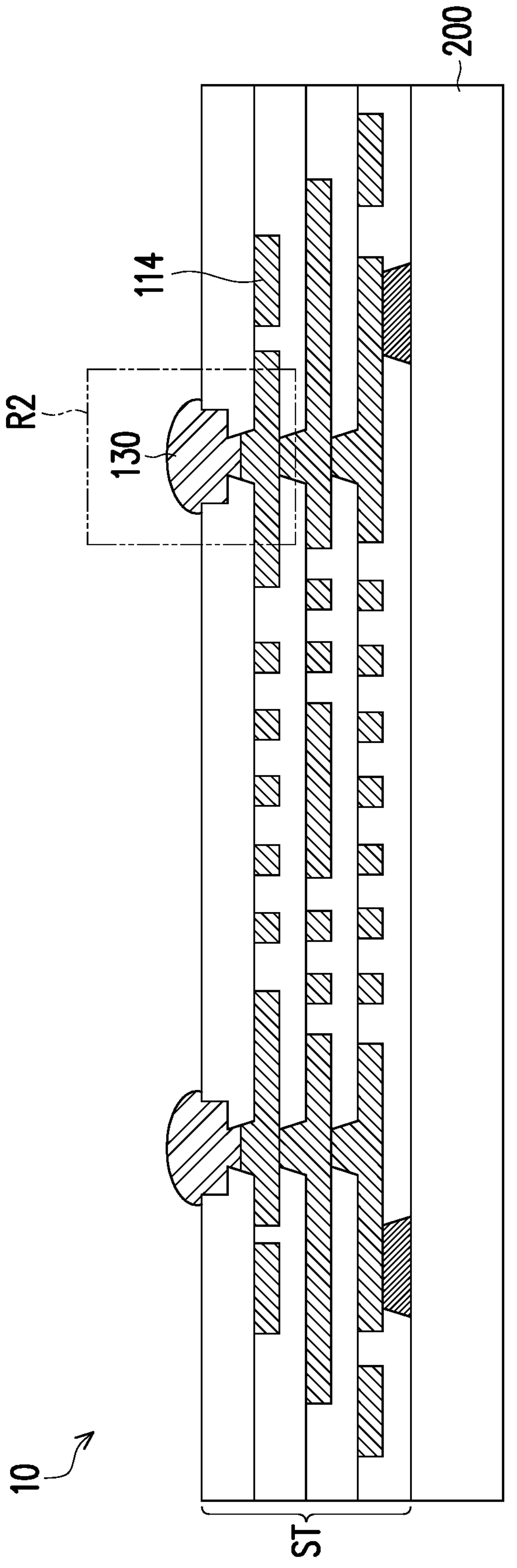
Figure 8A:
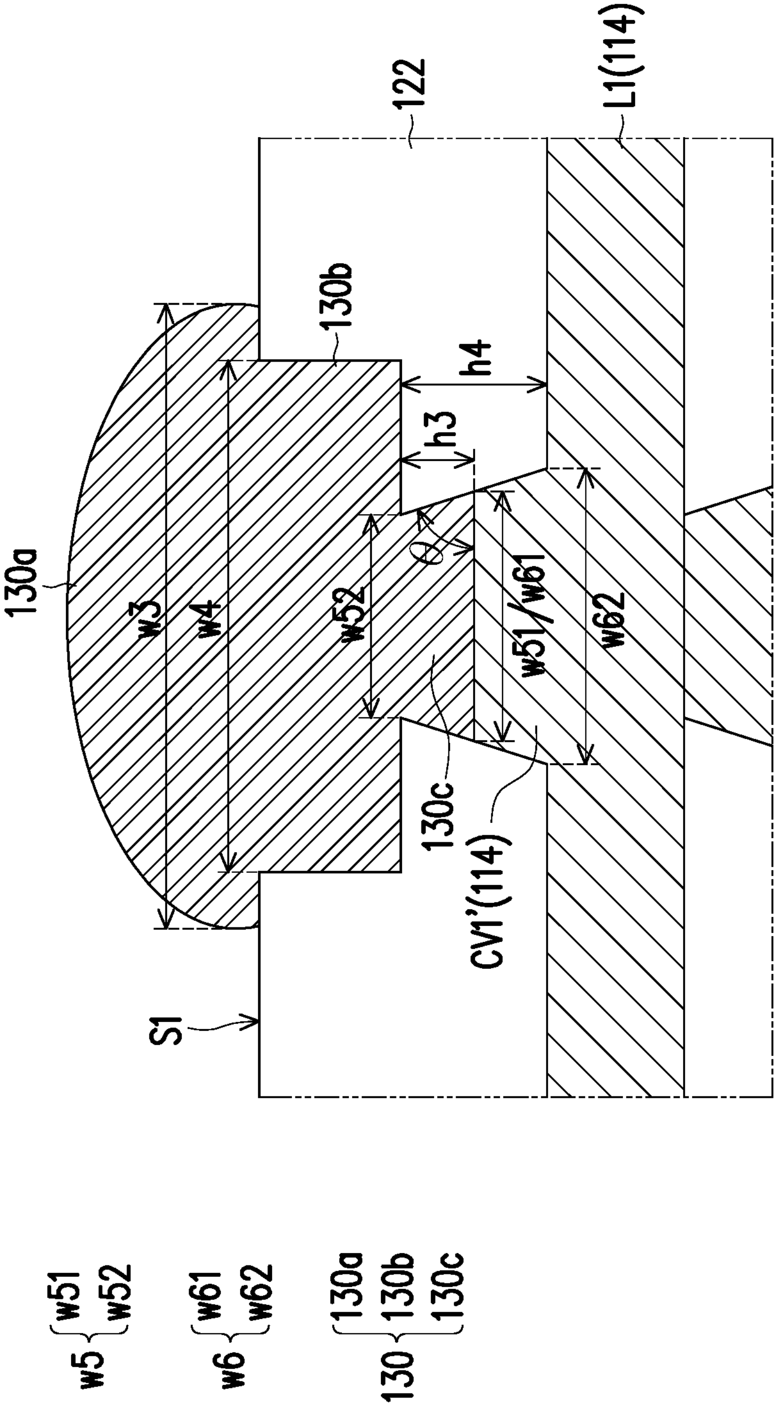
FIG. 8A is a partial enlarged cross-sectional schematic view of FIG. 8.

Referring to FIG. 8 and FIG. 8A, a conductive terminal 130 is formed in the first opening OP1 and the second opening OP2 to be electrically connected to the first conductive layer 114. The conductive terminal 130 may be a solder ball, but the disclosure is not limited thereto. The conductive terminal 130 may include a first portion 130*a*, a second portion 130*b*, and a third portion 130*c*. The first portion 130*a* protrudes from the first surface S1 of the line structure ST. The second portion 130*b* is filled into the first opening OP1 (marked in FIG. 7A) and is in contact with the first portion 130*a* and the third portion 130*c*. The third portion 130*c* is filled into the second opening OP2 (marked in FIG. 7A) and is in contact with the conductive connecting member CV1'.

In some embodiments, a maximum width w3 of the first portion 130*a* is greater than a width w4 of the second portion 130*b*, and the width w4 of the second portion 130*b* is greater than a width w5 of the third portion 130*c*. Since the third portion 130*c* has an inclined side wall, the width w5 of the third portion 130*c* changes with its height. The third portion 130*c* has a first width w51 on a side close to the first conductive layer 114, the third portion 130*c* has a second width w52 on a side away from the first conductive layer 114, and the first width w51 is greater than the second width w52. It is seen that the third portion 130*c* is a structure with a narrow top and a wide bottom. Since the third portion 130*c* is a structure with a narrow top and a wide bottom, the conductive terminal 130 is effectively fixed on the first insulating layer 122, thereby reducing the possibility of the conductive terminal 130 falling off.

In some embodiments, the maximum width w3 of the first portion 130*a* may be between 50 μm and 220 μm. The width w4 of the second portion 130*b* is between 50 μm and 200 μm. The first width w51 of the third portion 130*c* may be between 12.5 μm and 57.5 μm, and the second width w52 of the third portion 130*c* may be between 10 μm and 55 μm. However, the sizes of the first portion 130*a*, the second portion 130*b*, and the third portion 130*c* are not limited thereto. The first portion 130*a*, the second portion 130*b*, and the third portion 130*c* may be adjusted according to actual requirements, as long as the width w4 of the second portion 130*b* is greater than the width w5 of the third portion 130*c* and the first width w51 of the third portion 130*c* is greater than the second width w52 of the third portion 130*c*.

In some embodiments, a side of the conductive connecting member CV1' in contact with the third portion 130*c* has a third width w61, a side of the conductive connecting member CV1' in contact with the line portion L1 has a fourth width w62, and the fourth width w62 is greater than the third width w61. In some embodiments, the third width w61 of the conductive connecting member CV1' is basically the same as the first width w51 of the third portion 130*c*. In some embodiments, the fourth width w62 of the conductive connecting member CV1' may be between 15 μm and 60 μm, but the disclosure is not limited thereto.

The third portion 130*c* and the conductive connecting member CV1' are located in the via V1 of the first insulating layer 122 (marked in FIG. 2). In some embodiments, a height h3 of the third portion 130*c* is about half of a height h4 (i.e., the depth of the via V1), which is the sum of the height h3 of the third portion 130*c* and the height of the conductive connecting member CV1', so that the conductive terminal 130 is effectively fixed on the first insulating layer 122. For example, the height h3 of the third portion 130*c* may be between 2.5 μm and 10 μm, and the height h4, which is the sum of the height h3 of the third portion 130*c* and the height of the conductive connecting member CV1', may be between 5 μm and 20 μm, but the disclosure does not limit thereto.

After the above process, a circuit board structure 10 is basically completed.

Referring to FIG. 8 and FIG. 8A, the circuit board structure 10 includes a second carrier 200 (namely, a carrier), a first insulating layer 122, a line portion L1, and a conductive terminal 130. The line portion L1 is disposed on the carrier 200. The first insulating layer 122 is disposed on the line portion L1. The conductive terminal 130 is disposed on the first insulating layer 122 and embedded in the first insulating layer 122 to be electrically connected with the line portion L1. The conductive terminal 130 includes a first portion 130*a*, a second portion 130*b*, and a third portion 130*c*. The first portion 130*a* protrudes from a surface of the first insulating layer 122. The second portion 130*b* is embedded in the first insulating layer 122 and connected to the first portion 130*a*. The third portion 130*c* is disposed between the line portion L1 and the second portion 130*b*. A width w4 of the second portion 130*b* is greater than a width w5 of the third portion 130*c*. Since the conductive terminal 130 includes the second portion 130*b* and the third portion 130*c* embedded in the first insulating layer 122, the space of a portion of the pad is saved, so that the space is more effectively used in the wire routing design to enhance the performance of the circuit board structure 10.

In some embodiments, the third portion 130*c* has a first width w51 on a side close to the line portion L1, the third portion 130*c* has a second width w52 on a side away from the line portion L1, and the first width w51 is greater than the second width w52. In this way, the conductive terminal 130 is effectively fixed in the first insulating layer 122, thereby reducing the possibility of breaking and falling off of the conductive terminal 130 and improving the reliability of the circuit board structure 10.

In some embodiments, the circuit board structure 10 further includes a conductive connecting member CV1' embedded in the first insulating layer 122 and disposed between the third portion 130*c* and the line portion L1. A side of the conductive connecting member CV1' in contact with the third portion 130*c* has a third width w61, and a side of the conductive connecting member CV1' in contact with the line portion L1 has a fourth width w62, and the fourth width w62 is greater than the third width w61. In some embodiments, the third width w61 of the conductive connecting member CV1' is basically the same as the first width w51 of the third portion 130*c*. The fourth width w62 of the conductive connecting member CV1' is larger than the second width w52 of the third portion 130*c*.

In some embodiments, the conductive connecting member CV1' overlaps the third portion 130*c* on a normal direction of the carrier 200.

In some embodiments, an included angle θ between a side wall of the third portion 130*c* and a top surface of the conductive connecting member CV1' is between 30 degrees and 85 degrees, so that the conductive terminal 130 is effectively fixed in the first insulating layer 122, thereby reducing the possibility of breaking and falling off of the conductive terminal 130.

Figure 9:
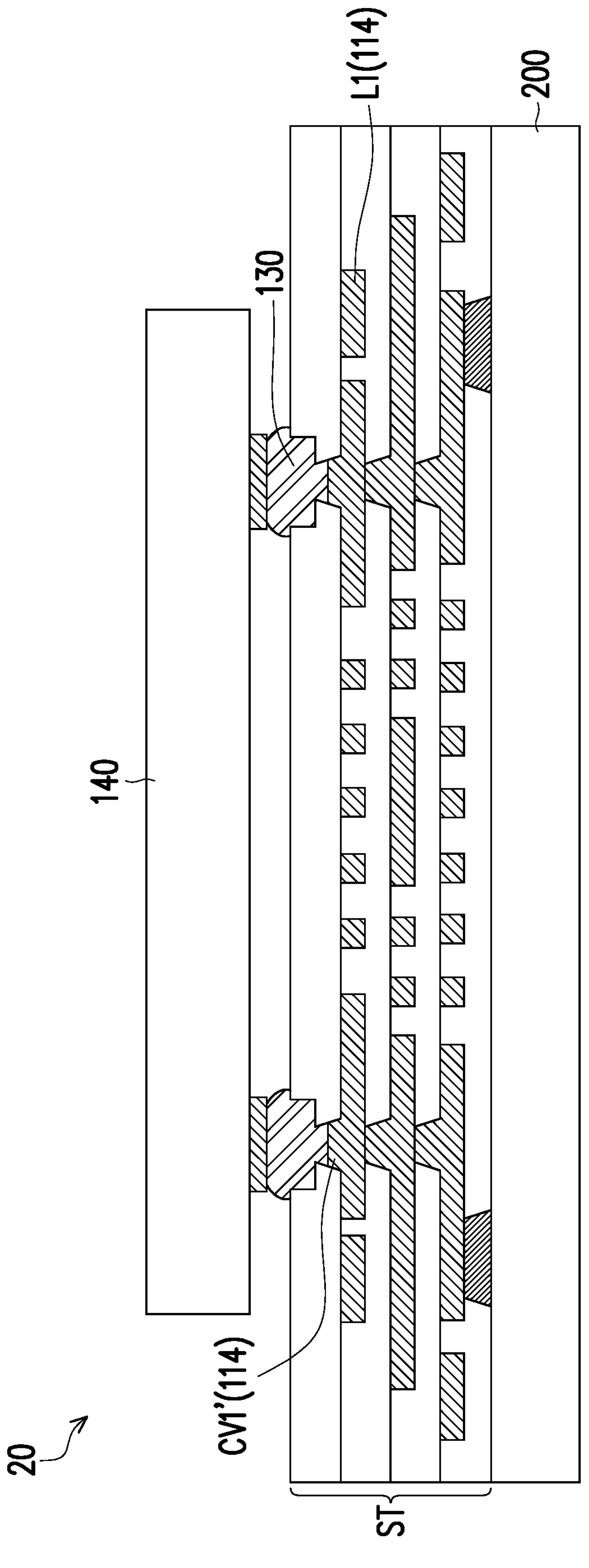
FIG. 9 is a cross-sectional schematic view of a circuit board structure according to another embodiment of the disclosure.

FIG. 9 is a cross-sectional schematic view of a circuit board structure according to another embodiment of the disclosure. It is noted here that the embodiment of FIG. 9 uses the reference numerals and a part of the contents of the embodiment of FIG. 8, and the same or similar reference numerals are used to denote the same or similar elements, and the description of the same technical content is omitted. For the description of the omitted part, reference may be made to the foregoing embodiment, and details are not described herein.

Referring to FIG. 9, the most significant difference between a circuit board structure 20 of this embodiment and the circuit board structure 10 is that the circuit board structure 20 further includes a chip 140. The chip 140 is disposed on the line structure ST and is electrically connected to the conductive layer 110 of the line structure ST through the conductive terminal 130.

To sum up, the conductive terminal of the circuit board structure of the disclosure includes the first portion protruding from the insulating layer and the second portion and third portion embedded in the insulating layer, which may save the space of a portion of the pad and make the space more effective for wire routing design. In addition, through the design of a narrow top and wide bottom structure of the third portion, the conductive terminal is effectively fixed in the insulating layer, thereby reducing the possibility of breaking and falling off of the conductive terminal and improving the reliability thereof. The manufacturing method of the circuit board structure of the disclosure uses an etching conductive portion to form the opening of the conductive terminal, which may improve the alignment tolerance in the process, simplify the process, and increase the process yield.

What is claimed is:

1. A circuit board structure, comprising:

a line portion;

a first insulating layer, disposed on the line portion; and a conductive terminal, disposed on the first insulating layer and embedded in the first insulating layer to be electrically connected with the line portion, wherein the conductive terminal is a solder ball which comprises:

a first portion, protruding from a surface of the first insulating layer;

a second portion, embedded in the first insulating layer and connected to the first portion; and a third portion, disposed between the line portion and the second portion, wherein the third portion has a first width on a side close to the line portion, the third portion has a second width on a side in direct contact with the second portion, and the first width is greater than the second width;

a conductive connecting member, disposed between the third portion and the line portion, wherein a bottom surface of the second portion is in direct contact with the third portion, and a width of the bottom surface of the second portion is greater than the second width.

2. The circuit board structure according to claim 1, wherein a side of the conductive connecting member in contact with the third portion has a third width, a side of the conductive connecting member in contact with the line portion has a fourth width, and the fourth width is greater than the third width.

3. The circuit board structure according to claim 2, wherein the third width is equal to the first width.

4. The circuit board structure according to claim 1, wherein an included angle between a side wall of the third portion and a top surface of the conductive connecting member is between 30 degrees and 85 degrees.

5. The circuit board structure according to claim 1, further comprising a carrier, wherein the line portion is disposed on the carrier.

* * * * *